United States Patent
Hayden et al.

(10) Patent No.: US 10,865,480 B2
(45) Date of Patent: *Dec. 15, 2020

(54) VAPOUR DEPOSITION METHOD FOR PREPARING AMORPHOUS LITHIUM-CONTAINING COMPOUNDS

(71) Applicants: Ilika Technologies Limited, Southampton (GB); Toyota Motor Corporation, Aichi (JP)

(72) Inventors: Brian Elliott Hayden, Lyndhurst (GB); Duncan Clifford Alan Smith, North Baddesley (GB); Christopher Edward Lee, Southampton (GB); Alexandros Anastasopoulos, Cambridge, MA (US); Chihiro Yada, Numazu (JP); Laura Mary Perkins, Southampton (GB); David Michael Laughman, Newbury (GB)

(73) Assignees: Ilika Technologies Limited, Romsey (GB); Toyota Motor Corporation, Aichi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/110,638

(22) PCT Filed: Jan. 7, 2015

(86) PCT No.: PCT/GB2015/050015
§ 371 (c)(1),
(2) Date: Jul. 8, 2016

(87) PCT Pub. No.: WO2015/104540
PCT Pub. Date: Jul. 16, 2015

(65) Prior Publication Data
US 2016/0340784 A1   Nov. 24, 2016

(30) Foreign Application Priority Data
Jan. 8, 2014   (GB) .................................. 1400274.5

(51) Int. Cl.
*C23C 16/40*   (2006.01)
*C23C 16/505*   (2006.01)
(Continued)

(52) U.S. Cl.
CPC .............. *C23C 16/505* (2013.01); *C03C 3/04* (2013.01); *C03C 3/089* (2013.01); *C03C 4/18* (2013.01);
(Continued)

(58) Field of Classification Search
CPC .......................... C23C 14/0021; H01M 4/0423
See application file for complete search history.

(56) References Cited

U.S. PATENT DOCUMENTS

| 4,374,162 A | 2/1983 | Takagi |
| 4,933,058 A | 6/1990 | Bache |

(Continued)

FOREIGN PATENT DOCUMENTS

| CN | 101479403 A | 7/2009 | |
| EP | 0454499 A2 * | 10/1991 | ......... G01N 21/8422 |

(Continued)

OTHER PUBLICATIONS

Joo et al. Thin Film Lithium ion conducting LiBSO solid electrolyte. Solid State Ionics, vol. 160, Issues 1-2. May 2003, pp. 51-59. (Year: 2003).*

(Continued)

*Primary Examiner* — David P Turocy
(74) *Attorney, Agent, or Firm* — Renner, Otto, Boisselle & Sklar, LLP

(57) ABSTRACT

A vapour deposition method for preparing an amorphous lithium-containing oxide or oxynitride compound not containing phosphorous comprises providing a vapour source of each component element of the compound, including at least a source of lithium, a source of oxygen, a source of nitrogen (Continued)

in the case of an oxynitride compound, and a source or sources of one or more glass-forming elements; heating a substrate to substantially 180° C. or above; and co-depositing the component elements from the vapour sources onto the heated substrate wherein the component elements react on the substrate to form the amorphous compound.

15 Claims, 5 Drawing Sheets

(51) Int. Cl.
| | | |
|---|---|---|
| C03C 4/18 | (2006.01) | |
| H01M 10/0562 | (2010.01) | |
| C23C 14/00 | (2006.01) | |
| C23C 14/24 | (2006.01) | |
| C23C 14/08 | (2006.01) | |
| C23C 14/06 | (2006.01) | |
| C03C 3/089 | (2006.01) | |
| H01M 10/052 | (2010.01) | |
| C03C 3/04 | (2006.01) | |
| C23C 16/30 | (2006.01) | |
| C23C 16/452 | (2006.01) | |
| H01M 10/0525 | (2010.01) | |

(52) U.S. Cl.
CPC ...... *C23C 14/0021* (2013.01); *C23C 14/0676* (2013.01); *C23C 14/08* (2013.01); *C23C 14/24* (2013.01); *C23C 16/308* (2013.01); *C23C 16/40* (2013.01); *C23C 16/452* (2013.01); *H01M 10/052* (2013.01); *H01M 10/0525* (2013.01); *H01M 10/0562* (2013.01); *C03C 2204/00* (2013.01); *H01M 2300/0071* (2013.01)

(56) References Cited

U.S. PATENT DOCUMENTS

| | | | |
|---|---|---|---|
| 5,016,563 A | 5/1991 | Murakami et al. | |
| 5,128,007 A | 7/1992 | Matsunaga et al. | |
| 5,338,625 A | 8/1994 | Bates et al. | |
| 5,804,054 A | 9/1998 | Bhattacharya et al. | |
| 6,017,654 A | 1/2000 | Kumta et al. | |
| 6,632,563 B1 | 10/2003 | Krasnov | |
| 6,863,699 B1 | 3/2005 | Krasnov et al. | |
| 6,982,132 B1 | 1/2006 | Goldner et al. | |
| 7,883,800 B2 | 2/2011 | Vinatier et al. | |
| 2001/0032666 A1 | 10/2001 | Jenson | |
| 2003/0186128 A1 | 10/2003 | Singh | |
| 2004/0058237 A1* | 3/2004 | Higuchi | H01M 6/188 429/209 |
| 2004/0258984 A1 | 12/2004 | Ariel | |
| 2005/0016458 A1 | 1/2005 | Zhang | |
| 2005/0130032 A1 | 6/2005 | Krasnov et al. | |
| 2009/0026065 A1* | 1/2009 | Nukeaw | C23C 14/0073 204/157.44 |
| 2009/0057136 A1 | 3/2009 | Wang et al. | |
| 2009/0081554 A1* | 3/2009 | Takada | H01M 4/13 429/322 |
| 2010/0104942 A1* | 4/2010 | Lange | H01M 4/661 429/206 |
| 2010/0261071 A1 | 10/2010 | Lopatin | |
| 2012/0058280 A1 | 3/2012 | Chung | |
| 2012/0058380 A1 | 3/2012 | Wang et al. | |
| 2012/0237835 A1 | 9/2012 | Yada | |
| 2012/0319034 A1* | 12/2012 | Awano | C01G 23/005 252/182.1 |
| 2013/0011738 A1 | 1/2013 | Zhou | |
| 2013/0189588 A1 | 7/2013 | Yada et al. | |
| 2015/0203975 A1 | 7/2015 | Hoormann | |
| 2016/0340772 A1 | 11/2016 | Smith et al. | |
| 2016/0340784 A1 | 11/2016 | Hayden et al. | |

FOREIGN PATENT DOCUMENTS

| | | | |
|---|---|---|---|
| EP | 0454499 A2 * | 10/1991 | ........ G01N 21/8422 |
| EP | 1305838 | 2/2007 | |
| EP | 1900845 | 3/2008 | |
| EP | 2824738 A1 | 1/2015 | |
| GB | 2493020 A | 1/2013 | |
| GB | 2493022 A | 1/2013 | |
| JP | S63-035493 A | 2/1988 | |
| JP | H01317199 A | 12/1989 | |
| JP | H04187759 A | 7/1992 | |
| JP | H08329944 A | 12/1996 | |
| JP | 2003277915 | 10/2003 | |
| JP | 2005038844 A | 2/2005 | |
| JP | 2006-120437 | 5/2006 | |
| JP | 2006120437 A | 5/2006 | |
| JP | 2006120437 A * | 5/2006 | |
| JP | 2013-151721 | 8/2013 | |
| JP | 2013-187024 | 9/2013 | |
| KR | 20030094759 A | 12/2003 | |
| KR | 20040098139 A | 11/2004 | |
| KR | 20080003679 A | 1/2008 | |
| WO | 2001073957 | 10/2001 | |
| WO | 2005035820 | 4/2005 | |
| WO | WO 2013/011326 A1 | 1/2013 | |
| WO | WO 2013/011327 A2 | 1/2013 | |

OTHER PUBLICATIONS

Samuneva et al. Structure and optical property of niobium silicate glasses. Jornal of Non-crytalline solids. vol. 129, Issues 1-3. Mar. 1991, pp. 54-63. (Year: 1991). Abstract.*
International Search Report and Written Opinion for corresponding Patent Application No. PCT/GB2015/050015 dated Mar. 25, 2015.
Combined Search and Examination Report for corresponding United Kingdom Patent Application No. GB 1400274.5 dated Jul. 9, 2014.
Julien et al.; "Chapter 1. Design and Optimisation of Solid State Batteries", Solid State Batteries: Materials Design and Optimization, 1994, pp. 49-51.
Julien et al.; "Chapter 4, Materials for electrolyte: Thin Films", Solid State Batteries: Materials Design and Optimization, 1994, pp. 285-298.
Bates et al.; "Rechargeable Thin Film Lithium Batteries", Oak Ridge National Lab and Solid State Ionics, 1993.
Guerin et al.; "Physical Vapor Deposition Method for the High-Throughput Synthesis of Solid-State Material Libraries", Journal of Combined Chemistry, 2006, vol. 8, pp. 66-73.
Varshneya, A.K.; "Fundamentals of Inorganic Glasses", Academic Press, 1994, p. 33.
Hu et al.; "Influence of sputtering pressure on the structure and ionic conductivity of thin film amorphous electrolyte", Journal of Material Science, 2011, vol. 46, pp. 7588-7593.
Choi et al.; "Radio-Frequency Magnetron Sputtering Power Effect on the Ionic Conductivities of Lipon Films", Electrochemical and Solid-State Letters, 2002, vol. 5(1), pp. A14-A17.
Zhao et al.; "A solid-state electrolyte lithium phosphorus oxynitride film prepared by pulsed laser deposition", Thin Solid Films, 2002, vol. 415, pp. 108-113.
Joo et al.; "Thin film lithium ion conducting LiBSO solid electrolyte", Solid State Ionics, 2003, vol. 160, pp. 51-59.
Tatsumisago et al.; "Mixed Anion Effect in Conductivity of Rapidly Quenched $Li_4SiO_4$—$Li_3BO_3$ Glasses", Yogyo-Kyokai-Shi, 1987, vol. 95(2), pp. 197-201.
Machida et al.; "Preparation of amorphous films in the systems $Li_2O_2$ and $Li_2O$—$B_2O_3$—$SiO_2$ by RF-sputtering and their ionic conductivity", Yogyo-Kyokai-shi, 1987, vol. 95(1), pp. 135-137.
Office Action issued from the Japanese Intellectual Property Office for corresponding Japanese Application 2016-544673 dated May 1, 2017 including English translation.
Sahan et al., "Improvement of the electrochemical performance of LiMn2O4 cathode active material by lithium borosilicate (LBS) surface coating for lithium-ion batteries", Journal of Alloys and Compounds, Jan. 14, 2011, vol. 509, No. 11, pp. 4235-4241.

(56) References Cited

OTHER PUBLICATIONS

Kim et al., "Fabrication of a high lithium ion conducting lithium borosilicate glass"; Journal of Non-Crystalline Solids, Apr. 15, 2011, vol. 357, No. 15, pp. 2863-2867.

Search Report issued from the European Patent Office for corresponding European Patent Application 17201720.4-1103 dated Feb. 5, 2018.

Tang et al.; "Comparative study of $LiMn_2O_4$ thin film cathode grown at high, medium and low temperatures by pulsed laser deposition", Journal of Solid State Chemistry, 2006, vol. 179 (12), pp. 3831-3838.

Thornton et al.; "Sputter Deposition Processes", Handbook of Deposition Technologies for Films and Coatings, 1994, second edition, pp. 249-272.

Wang et al.; "High power and capacity of $LiNi_{0.5}Mn_{1.5}O_4$ thin films cathodes prepared by pulsed laser deposition", Electrochimica Acta. 2013, vol. 102, pp. 416-422.

Singh et al.; "Challenges in making of thin films for $Li_xMn_yO_4$ rechargeable lithium batteries for MEMS", Journal of Power Sources, 2001, vol. 97-98, pp. 826-831.

Jayanth Babu, et al.; "Microstructural and electrochemical properties of rf-sputtered $LiMn_2O_4$ thin film cathodes", Appl. Nanosci. 2012, vol. 2, pp. 401-407.

Baggetto et al.; "Fabrication and characterization of Li—Mn—Ni—O sputtered thin film high voltage cathodes for Li-ion batteries", Journal of Power Sources, 2012, vol. 211, pp. 108-118.

Zhong et al.; "Synthesis and Electrochemistry of $LiNi_xMn_{2-x}O_4$" Journal of Electrochemical Society, 1997, vol. 144(1), pp. 205-213.

Chen et al.; "High rate performance of $LiMn_2O_4$ cathodes for lithium ion batteries synthesized by low temperature oxygen plasma assisted sol-gel process", Thin Solid Films, 2013, vol. 544, pp. 182-185.

Park et al.; "Characterization of tin oxide/$LiMn_2O_4$ thin-film cell", Journal of Power Sources, 2000, vol. 88, pp. 250-254.

Wang et al.; "Synthesis, Crystal Structure, and Ionic Conductivity of a Polycrystalline Lithium Phosphorus Oxynitride with the y—$Li3PO4$ Structure", Journal of Solid State Chemistry, 1995, vol. 115(2), pp. 313-323, Abstract.

Beal et al.; "High Throughput Methodology for Synthesis, Screening, and Optimization of Solid State Lithium Ion Electrolytes", ACS Combinatorial Science, 2011, vol. 13 Issue 4, pp. 375-38.

Search Report issued from the European Patent Office for European Patent Application 17201719 dated Feb. 5, 2018.

\* cited by examiner

VAPOUR DEPOSITION METHOD FOR PREPARING AMORPHOUS LITHIUM-CONTAINING COMPOUNDS

This application is a national phase of International Application No. PCT/GB2015/050015 filed Jan. 7, 2015 and published in the English language, which claims priority to United Kingdom Patent Application No. 1400274.5 filed Jan. 8, 2014, which are hereby incorporated herein by reference in their entirety.

BACKGROUND OF THE INVENTION

The present invention relates to a method for preparing amorphous lithium-containing compounds, particularly oxides and oxynitrides, by vapour deposition.

The deposition of materials in thin film form is of great interest owing to the many applications of thin films, and a range of different deposition techniques are known. Various of the techniques are more or less suitable for particular materials, and the quality, composition and properties of the thin film produced typically depends greatly on the process used for its formation. Consequently, much research is devoted to developing deposition processes that can produce thin films appropriate for specific applications.

An important application of thin film materials is in solid state thin film cells or batteries, such as lithium ion cells. Such batteries are composed of at least three components. Two active electrodes (the anode and the cathode) are separated by an electrolyte. Each of these components is formed as a thin film, deposited in sequence on a supporting substrate. Additional components such as current collectors, interface modifiers and encapsulations may also be provided. In manufacture, the components may be deposited in the order of cathode current collector, cathode, electrolyte, anode, anode current collector and encapsulation, for example.

In the lithium ion example, the anode and the cathode are capable of reversibly storing lithium. Other requirements of the anode and cathode materials are high gravimetric and volumetric storage capacities which can be achieved from a low mass and volume of material, while the number of lithium ions stored per unit should be as high as possible. The materials should also exhibit acceptable electronic and ionic conduction so that ions and electrons can move through the electrodes during the battery charge and discharge process.

Otherwise, the anode, cathode and electrolyte require different properties. The cathode should present reversible lithium intercalation at high potentials, while the anode should present reversible lithium intercalation at low potentials.

The electrolyte physically separates the anode and cathode, so it must have extremely low electrical conductivity to prevent short circuiting of the battery. However, to enable reasonable charge and discharge properties the ionic conductivity of the material must be as high as possible. Furthermore the material must be stable during the cycling process and not react with either the cathode or the anode.

A significant challenge in solid state battery development has been the identification of solid electrolytes with sufficiently high ionic conductivity, low electronic conductivity, low mechanical stress resulting from required electrochemical cycling and reproducible high yield production methods.

Both crystalline and non-crystalline (amorphous) materials have been considered as electrolytes. Crystalline materials such as lithium lanthanum titanate (LLTO), thio-LISICON, NASICON-type ($Li_{1+x+y}Al_x(Ti,Ge)_{2-x}Si_yP_{3-y}O_{12}$), and $Li_{10}GeP_2S_{12}$ generally exhibit excellent ionic conductivity (for example up to $1.2\times10^{-2}$ S cm$^{-1}$ in the case of $Li_{10}GeP_2S_{12}$) so appear to be good candidates for electrolytes. However, these materials present problems when applied to battery systems. In the case of the oxides (LLTO, thio-LISICON and NASICON-type) the transition metals within the electrolyte are prone to reduction which causes the material to exhibit electronic conductivity and thus short circuit the battery. The sulphide systems, such as $Li_{10}GeP_2S_{12}$, present extremely high conductivities but are prone to decomposition when exposed to air and water, causing the release of toxic $H_2S$ and a deterioration in performance. Furthermore, both oxide and sulphide crystalline electrolytes require extremely high processing temperatures. For these reasons crystalline electrolytes have not been utilised in commercial thin film battery systems.

Amorphous electrolytes such as lithium phosphorous oxynitride (LiPON), lithium silicate and lithium borosilicates exhibit much lower levels of ionic conductivity. Although the optimum conductivity of these materials is approximately two orders of magnitude lower than that of the crystalline materials, this has been determined to be acceptable if the electrolyte is less than $1\times10^{-6}$ m thick (Julien, C. M.; Nazri, G. A., Chapter 1. Design and Optimisation of Solid State Batteries. In *Solid State Batteries: Materials Design and Optimization,* 1994). LiPON has an acceptable ionic conductivity of $3\times10^{-6}$ S cm$^{-1}$ and has been shown to be stable in air and when cycled against lithium. For these reasons, coupled with its ease of manufacture, it has been widely adopted in the first generation of solid state batteries (Bates, J. B.; Gruzalski, G. R.; Dudney, N. J.; Luck, C. F.; Yu, X., Rechargeable Thin Film Lithium Batteries. *Oak Ridge National Lab and Solid State Ionics* 1993; Bates, J. B.; Dudney, N. J.; Neudecker, B.; Gruzalski, G. R.; Luck, C. F. Thin Film Battery and Method for Making Same, U.S. Pat. No. 5,338,625). The amorphous nature of these electrolytes is critical to their performance; crystalline UPON has an ionic conductivity seven orders of magnitude lower than the amorphous material. However, the amorphous LiPON will crystallise at temperatures lower than those typically needed to anneal cathode materials such as LMO ($LiMn_2O_4$, lithium manganese oxide and LMNO ($LiMn_{1.5}Ni_{0.5}O_4$, lithium manganese nickel oxide using standard synthesis techniques, thereby complicating the manufacture of a thin film battery comprising these materials.

Hence, amorphous electrolytes are of great interest. An alternative to LiPON is amorphous lithium borosilicate. Amorphous lithium borosilicate materials with ionic conductivity comparable to LiPON have been produced, but by methods requiring rapid quenching (Tatsumisago, M.; Machida, N.; Minami, T., Mixed Anion Effect in Conductivity of Rapidly Quenched $Li_4SiO_4$—$Li_3BO_3$ Glasses. *Yogyo-Kyokai-Shi* 1987, 95, (2), 197-201). This synthetic method gives rise to irregular 'sprats' of glass, which are not suitable for processing into thin film batteries. Synthesis by sputtering of similar compositions has been attempted in thin films, but these were not successful, resulting in materials with significantly reduced conductivities when compared to the rapidly quenched glass (Machida, N.; Tatsumisago, M.; Minami, T., Preparation of amorphous films in the systems $Li_2O_2$—$SiO_2$ and $Li_2O$—$B_2O_{3-Si}O_2$ by RF-sputtering and their ionic conductivity. *Yogyo-Kyokai-Shi* 1987, 95, (1), 135-7).

Many different thin film deposition methods have been proposed to date, which suffer from a range of drawbacks.

Synthetic routes to thin films, which are generally referred to using the umbrella term of 'physical vapour deposition' include pulsed laser deposition, flash evaporation, sputtering and thermal evaporation, the most widespread method being sputtering. In this method a target of a particular composition is sputtered using plasma formed over the target; the resulting vapour condenses on a substrate, thereby forming the thin film. Sputtering involves the deposition of materials directly from a target. The product of the sputter varies and may include dimers, trimers or higher order particles.

The deposition rate, composition, morphology, crystallinity and performance of sputtered thin films are determined by a complex relationship with the sputtering parameters used. The most widely used electrolyte, LiPON, is widely synthesized using a lithium phosphate target sputtered in a nitrogen plasma. Despite the relatively simple system and much research there still remains some disagreement over the effect of sputtering parameters (power, and $N_2$ pressure) on the performance of LiPON as a solid state electrolyte. In part this is due to the confounding of deposition parameters with film characteristics. For example, modifying the nitrogen pressure within the sputtering system is known to alter the ratio of N:P, but the Li:P ratio is additionally changed (Hu, Z.; Xie, K.; Wei, D.; Ullah, N., Influence of sputtering pressure on the structure and ionic conductivity of thin film amorphous electrolyte. *Journal of Materials Science* 2011, 46, (23), 7588-7593). In a further example, modifying only the source power while retaining a fixed nitrogen pressure results in a relatively fixed Li:P ratio, a change in the N:P ratio but also a change in the deposition rate (Choi, C. H.; Cho, W. I.; Cho, B. W.; Kim, H. S.; Yoon, Y. S.; Tak, Y. S., Radio-Frequency Magnetron Sputtering Power Effect on the Ionic Conductivities of Lipon Films. *Electrochemical and Solid-State Letters* 2002, 5, (1), A14-A17). Therefore, it is very difficult to alter the individual parameters of the deposited film (for example, concentration of a single element, deposition rate or crystallinity) without affecting other properties of the film. This makes optimisation of film and therefore battery properties extremely difficult.

Pulsed laser deposition (PLD) shares many properties with sputtering, owing to the use of a compositionally unique target and high energies. The control mechanisms are convoluted as with sputtering, for example the laser fluence may affect both the deposition rate and the nitrogen uptake when depositing LiPON. As with sputtering, this route also yields rough samples. The surface morphology of LiPON films prepared by PLD has been noted to be very rough, with formation of particulates and droplets (Zhao, S.; Fu, Z.; Qin, Q., A solid-state electrolyte lithium phosphorus oxynitride film prepared by pulsed laser deposition. *Thin Solid Films* 2002, 415, (1-2), 108-113).

Deposition of thin films from thermal evaporation sources is possible using compound sources, and has been demonstrated for materials such as LMO ($LiMn_2O_4$, lithium manganese oxide) and $B_2O_3$—$Li_2O$ (Julien, C. M.; Nazri, G. A., Chapter 4. Materials for electrolyte: Thin Films. In *Solid State Batteries: Materials Design and Optimization*, 1994). In this instance the particle energies are much lower than those encountered in sputtering. However, problems such as variation in composition between source and resultant thin film are common to all routes which begin with compound evaporation targets (sputtering, PLD). Furthermore it has been noted that a relationship between substrate temperature and the composition of the deposited film exists once again resulting in difficulties in optimising material performance due to a confounding of parameters.

An alternative is thermal evaporation directly from the elements, but this is uncommon. Julien and Nazri (reference above) allude to an attempt to synthesize $B_2O_3$-$xLi_2O$-$yLi_nX$ (X=I, Cl, $SO_4$ and n=1, 2) directly from the elements, but no results are reported and the authors comment that "the difficulties in implementing this technique stay in enhancing the oxygen pumping, avoiding the high oxygen reactivity with the heated parts of the system, and making available an oxygen monoatomic source in order to enhance oxygen reactions on the surface"

Nevertheless, the present inventors have previously demonstrated the synthesis of phosphorous-containing materials directly from the constituent elements (WO 2013/011326; WO 2013/011327). However, a complexity in this process is the use of a cracker to break down phosphorous so as to enable the formation of phosphates. The synthesis of cathode (lithium iron phosphate—example 5, lithium manganese phosphate—example 7) and electrolyte materials ($Li_3PO_4$—example 1 and nitrogen doped $Li_3PO_4$—example 6) is disclosed. The deposited materials are amorphous; annealing is used to crystallise the cathode materials. Although this work demonstrates two of the three basic building blocks for producing a thin film cell, it does not demonstrate an operational cell. Furthermore, the ionic conductivities demonstrated in this work are too low to enable a cell to function correctly at room temperature. It is widely known that a conductivity of $1 \times 10^{-6}$ S $cm^{-1}$ at room temperature is required for satisfactory performance, but this was not demonstrated.

The efforts required to overcome these many difficulties in the various deposition processes and the complexities involved in developing new materials mean that the vast majority of thin film batteries are limited to using LiPON as an electrolyte, deposited as a thin film by sputtering. Clearly, improved methods of making thin films of other electrolyte materials are desirable so that thin film battery technology can be developed and enhanced.

The inventors' previous work (WO 2013/011326; WO 2013/011327) showing the deposition of thin films of phosphate materials from constituent elements suggests that the technique might be possible for other materials, such as lithium borosilicate. However, it has been found that following the method described for phosphates while using the constituent elements of lithium borosilicate does not produce the desired thin film. The elements fail to react on the substrate in the manner expected from the phosphate work so that the required compound is not created. Using molecular oxygen instead of atomic oxygen overcomes this problem, however the lithium borosilicate phase of interest is generally only achieved when the substrate temperature is reasonably low. For example, deposition of lithium borosilicate onto a substrate with a platinum layer and utilising molecular oxygen at elevated temperatures results in the formation of crystalline $LiPt_7$, an unwanted phase. Furthermore, Raman spectra of the materials deposited at elevated temperatures do not exhibit the bands associated with the lithium borosilicate phase of interest. Also, the resulting amorphous lithium borosilicate will crystallise when subjected to the elevated temperatures required for producing and processing other components of a battery, or if the battery is for use at high temperature, thereby destroying its electrolyte qualities.

SUMMARY OF THE INVENTION

Accordingly, a first aspect of the present invention is directed to a vapour deposition method for preparing an amorphous lithium-containing oxide or oxynitride compound not containing phosphorous, the method comprising: providing a vapour source of each component element of the compound, wherein the vapour sources comprise at least a source of lithium, a source of oxygen, and a source or sources of one or more glass-forming elements; heating a substrate to substantially 180° C. or above; and co-depositing the component elements from the vapour sources onto the heated substrate wherein the component elements react on the substrate to form the amorphous compound.

This provides a very simple method for forming lithium-containing oxide and oxynitride compounds, in which the compounds produced are amorphous and therefore suitable for applications such as thin film battery electrolytes. The deposition of each component element directly from its own vapour source allows close control of the flux of each element so that the stoichiometry of the deposited compound can be precisely tailored.

In some embodiments, the substrate may be heated to between substantially 180° C. and 350° C. Avoidance of excessive substrate temperatures may reduce the risk of crystallisation of the compound, and can also improve chemical composition since higher temperatures may lead to a reduced deposition of one or more of the compound elements.

To produce oxynitride compounds, the vapour sources may further comprise a source of nitrogen, so that the amorphous compound is a lithium-containing oxynitride compound not containing phosphorous. The nitrogen source may be a separate nitrogen supply, or may be arranged to supply nitrogen into a gas feed of the oxygen source so as to provide a mixed oxygen and nitrogen vapour source.

The vapour source of oxygen may be a vapour source of atomic oxygen, such as an ozone source or a plasma source, although other oxygen sources are not precluded. Atomic oxygen is advantageous where other component elements are required in the compound in a high oxidation state Where the amorphous compound is a lithium-containing oxynitride compound not containing phosphorous and the oxygen source is a plasma source, the method may comprise introducing nitrogen into a feed of the plasma source to provide a mixed oxygen-nitrogen plasma for co-deposition onto the heated substrate.

The source or sources of one or more glass-forming elements may comprise a source of boron and a source of silicon, so that the amorphous compound is lithium borosilicate. This material is of particular interest as a battery electrolyte, and samples produced according to embodiments of the invention show favourable ionic conductivity properties indicating that use as an electrolyte is possible.

The vapour sources may further comprise a source of nitrogen, so that the amorphous compound is nitrogen-doped lithium borosilicate. Doping with nitrogen can enhance the ionic conductivity to provide improved operation as an electrolyte. To achieve the doping, the vapour source of oxygen may comprise a plasma source with the nitrogen introduced into a feed of the plasma source to provide a mixed oxygen-nitrogen plasma for co-deposition onto the heated substrate.

To form doped and undoped lithium borosilicate, the method may comprise heating the substrate to between 180° C. and 275°, and more particularly to substantially 225° C.

The invention is applicable to other lithium-rich glasses. In other embodiments, the amorphous lithium-containing oxide or oxynitride compound not containing phosphorous is a lithium silicate, an oxynitride lithium silicate, a lithium borate or an oxynitride lithium borate. The source or sources of one or more glass-forming elements may comprise sources of one or more of boron, silicon, germanium, aluminium, arsenic and antimony.

Co-depositing the component elements onto the heated substrate may comprise co-depositing the component elements directly onto a surface of the heated substrate. Alternatively, co-depositing the component elements onto the heated substrate may comprise co-depositing the component elements onto one or more layers supported on the substrate. Thus the method is flexible, and allows a compound to be formed as a separate sample, or as a layer within a layered structure such as a thin film device.

A second aspect of the present invention is directed to a method of making a battery, comprising depositing an electrolyte of the battery as a layer of an amorphous lithium-containing oxide or oxynitride compound not containing phosphorous using a vapour deposition method according to the first aspect of the invention.

Other aspects of the invention are directed to a battery comprising an electrolyte in the form of a layer of an amorphous lithium-containing oxide or oxynitride compound not containing phosphorous deposited using a vapour deposition method according to the first aspect of the invention, and an electronic device comprising a battery having an electrolyte in the form of a layer of an amorphous lithium-containing oxide or oxynitride compound not containing phosphorous deposited using a vapour deposition method according to the first aspect of the invention.

A further aspect of the invention is directed to a sample of amorphous lithium-containing oxide or oxynitride compound not containing phosphorous deposited on a substrate using a vapour deposition method according to the first aspect of the invention.

A yet further aspect of the invention is directed to a thin film layer of nitrogen-doped lithium borosilicate. The thin film layer may be deposited on the surface of a substrate, or on one or more layers supported on a substrate, for example.

An additional aspect of the invention is directed to a vapour deposition method for preparing an amorphous lithium-containing oxide or oxynitride compound not containing phosphorous, the method comprising: providing a vapour source of each component element of the compound, wherein the vapour sources comprise at least a source of lithium, a source of molecular oxygen, and source or sources of one or more glass-forming elements; providing a substrate at a temperature below substantially 100° C.; and co-depositing the component elements from the vapour sources onto the substrate wherein the component elements react on the substrate to form the amorphous compound. The substrate may be heated to between substantially 18° C. and 30° C., for example to substantially 25° C.

Thus, it is possible to produce an amorphous lithium-containing oxide or oxynitride compound at lower temperatures by using molecular oxygen. This approach may be of interest if it is known that future exposure to high temperature (which may cause crystallisation) is not a concern.

A further aspect of the invention is directed to a sample of an amorphous lithium-containing oxide or oxynitride compound not containing phosphorous deposited on a substrate using a vapour deposition method according to the additional aspect.

BRIEF DESCRIPTION OF THE DRAWINGS

For a better understanding of the invention and to show how the same may be carried into effect reference is now made by way of example to the accompanying drawings in which.

DETAILED DESCRIPTION

The present invention provides a method for forming samples, including thin films, of amorphous lithium-containing oxide and oxynitride compounds without phosphorous, by vapour deposition. Each component element of the compound is provided separately as a vapour from a respective source, and the component element vapours are co-deposited onto a common heated substrate. The component elements react on the substrate to form the compound.

In the context of this disclosure, the term "element" means "element of the periodic table". The compounds formed according to the invention therefore comprise component elements including lithium (Li) and oxygen (O) in the case of oxide compounds and lithium (Li), oxygen (O) and nitrogen (N) in the case of oxynitride compounds. Additionally, one or more of the component elements comprise glass-forming elements. Other component elements will depend on the particular compound being formed, but in all cases each element in the compound is provided separately in the form of a vapour (or combined into a mixed vapour or plasma if appropriate), and each vapour deposits onto a common substrate.

Also in the context of this disclosure, the term "lithium-containing oxide compound" means "a compound containing lithium, oxygen and one or more other elements", and the term "lithium-containing oxynitride compound" means "a compound containing lithium, oxygen, nitrogen and one or more other elements", where "a compound" is "a substance or material formed by the combination of two or more elements in fixed proportions by a chemical reaction".

In the context of this disclosure, the term "amorphous" means "a solid that is not crystalline", i.e. that has no long range order in its lattice. It has been found that, according to the methods of the present invention, a desired compound can be deposited in amorphous form if one or more of the component elements from which the compound is deposited is a glass-forming element. Examples of glass-forming elements include boron (B), silicon (Si), germanium (Ge), aluminium (Al), arsenic (As) and antimony (Sb) (Varshneya, A. K., *Fundamentals of Inorganic Glasses*, Academic Press, page 33).

Figure 1:
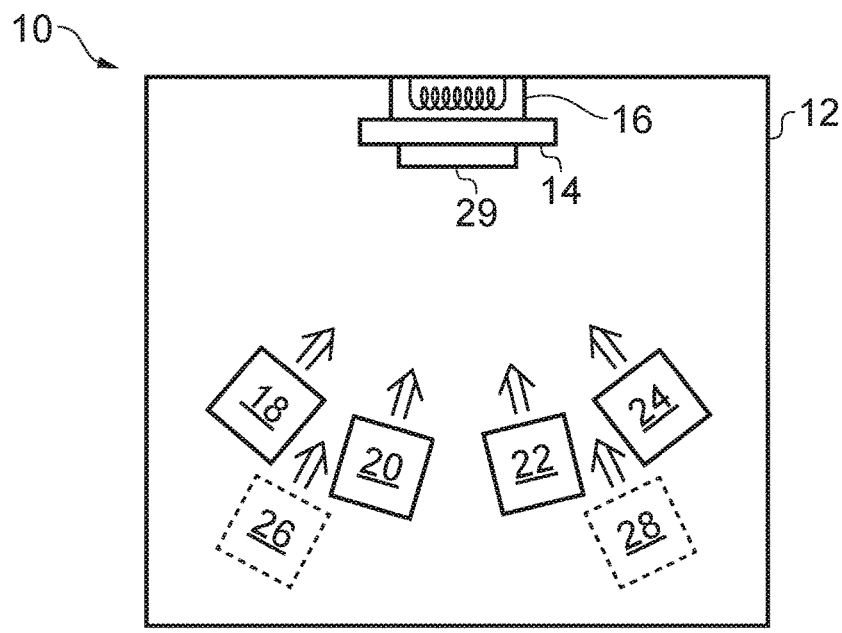
FIG. 1 shows a schematic representation of an example apparatus suitable for implementing a method according to embodiments of the invention.

FIG. 1 shows a schematic representation of an example apparatus 10 suitable for implementing an embodiment method of the invention. The deposition is carried out within a vacuum system 12, which may be an ultrahigh vacuum system. A substrate 14 of a desired material (depending on the intended purpose of the deposited amorphous compound) is mounted within the vacuum system 12, and heated above room temperature using a heater 16. The temperature is discussed further below. Also within the vacuum system are a plurality of vapour sources, one source for each of the component elements in the desired thin film compound. A first vapour source 18 comprises a source of atomic oxygen, such as an oxygen plasma source. A second vapour source 20 comprises a source of lithium vapour. A third vapour source 22 comprises a source of vapour of a glass-forming element. Fourth vapour source 24 comprises a source of any further component element of the desired compound. Any number of other vapour sources (such as 26, 28, shown in phantom) may optionally be included depending on the number of elements comprised in the compound material of interest. For example, if the compound is an oxynitride compound, one of the vapour sources may be a source of nitrogen. Alternatively, in a case where oxygen is provided from a plasma source, the nitrogen may be introduced though the plasma source to create a mixed nitrogen-oxygen plasma. None of the vapour sources provides phosphorous, however.

The nature of each vapour source will depend on the element it delivers, and also the amount of control required over the rate of delivery, or flux. A source may be a plasma source, for example, particularly in the case of the oxygen vapour source. A plasma source delivers plasma-phase oxygen, i.e. a flux of oxygen atoms, radicals and ions. The source may be a radio frequency (RF) plasma source, for example. Atomic oxygen is advantageous when depositing compounds that comprise elements in high oxidation states Oxygen may alternatively be provided using an ozone source. A plasma source such as an RF plasma source may also be used to deliver the nitrogen component vapour, if an oxynitride compound is to be formed.

Electron beam evaporators and Knudsen cells (K-Cells) are other examples of vapour sources; these are well-suited for materials with low partial pressures. In both cases the material is held in a crucible and heated to generate a flux of material. A Knudsen cell uses a series of heating filaments around the crucible, whereas in an electron beam evaporator the heating is achieved by using magnets to direct a beam of high energy electrons onto the material.

Other example vapour sources are effusion cells and cracking sources. Embodiments of the invention eliminate any need for cracking, however, and thereby avoid the complexity inherent in the use of such sources. Further alternative vapour sources will be evident to the skilled person.

During the deposition process, a controlled flux of each component element is released from its respective vapour source 18-28 onto the heated substrate 14, whereupon the various elements are co-deposited. The elements react on the substrate 14 to form a thin film layer 29 of the amorphous lithium-containing oxide or oxynitride compound.

The reaction of the component elements to form the compound occurs on the surface of the substrate rather than in the vapour phase prior to deposition on the substrate. While not wishing to be bound by theory, it is believed that each component element in the vapour form collides with and adheres to the surface of the heated substrate, where the atoms of each element are then mobile on the surface and so are able to react with each other to form the oxide or oxynitride compound.

Performing the process in a vacuum ensures that the mean free path of the vapour phase particles (mean distance travelled before collision with another particle) travelling in the vacuum from their respective sources is long so that the chance of collisions between particles prior to deposition on the substrate is minimised. Advantageously, therefore, the distance from the sources to the substrate is arranged to be less than the mean free path to increase the chance of the particles reaching the substrate without colliding, thereby avoiding vapour phase interactions. Reaction of the component elements is hence limited to the heated substrate surface and the quality of the thin film compound material is enhanced.

A significant advantage of the invention is that deposition of the constituents of the compound directly from the elements allows for direct control of the compound composition via the rates of deposition of the component elements. The flux of each element can be independently controlled by appropriate operation of its respective vapour source so that the chemical composition of the deposited compound can be tailored according to exacting requirements if desired. Direct control of the stoichiometry of the deposited compound is therefore possible by controlling the flux, and hence consequently the rate of deposition, of each component element. Conventional deposition techniques such as sputtering and pulsed laser deposition can suffer from preferential loss of lighter elements so control of the proportion of the elements in the final compound is more difficult.

Also, deposition directly from the component elements eliminates the need for sputtering targets or precursors, and additional elements can be incorporated directly with no requirement to prepare new deposition targets. Further, it enables the deposition of smooth dense films with undamaged surfaces. Vapour sources such as those exemplified above produce lower energy particles than those produced by sputtering; this lower energy prevents cluster formation and reduces surface roughness of the deposited thin film, which is also a problem with pulsed laser deposition.

Importantly, the invention allows the formation of amorphous lithium-rich compounds. The amorphous nature makes the compounds suitable for use as electrolytes in thin film batteries. Under conventional synthetic conditions for both bulk and thin film samples, these compounds are known to crystallise which impairs their performance as electrolytes. The present invention is thus beneficial in offering a technique for making lithium-based thin film electrolytes.

A feature of the invention is the heating of the substrate. Prior work by the inventors (WO 2013/011326, WO 2013/011327) showing the synthesis of amorphous phosphorous-containing thin film materials by direct deposition of the constituent elements onto a substrate at room temperature suggested that the technique might be possible for other materials, for example lithium-rich glasses. A candidate of interest was lithium borosilicate, owing to its suitability as an electrolyte when in amorphous form. However, use of the method known for phosphates with the component elements of lithium borosilicate failed to produce the desired thin film. Under the conditions described in WO 2013/011326 and WO 2013/011327, the component elements do not react on the substrate in the expected manner and the required compound is not created. A solution was found by replacing atomic oxygen with molecular oxygen; although this produced the desired amorphous lithium borosilicate at relatively low temperatures, the amorphous material will then crystallise at the higher temperatures used in other battery manufacturing and processing steps, or if the battery is used at high temperature. There is also the risk of cracking of the deposited film during subsequent temperature cycling. Samples deposited at elevated temperature in the presence of molecular oxygen failed to form in the required phase.

The change of state from amorphous to crystalline at high temperatures is well-known, and deliberately employed in the process of annealing to make crystalline materials by heating amorphous materials. Hence, it is conventionally understood that high temperatures should be avoided in environments where a material needs to retain an amorphous character.

Consequently, it is a surprising and unexpected result that samples of amorphous lithium-containing oxides and oxynitrides can be successfully fabricated by depositing vapour phase component elements directly onto a substrate which has been heated. One would expect the heating to cause the deposited compound to be crystalline, but according to the present invention this is not the case. Heating of the substrate to about 180° C. or above when one or more of the component elements is a glass-forming element has been found to create the necessary conditions for the component elements to successfully react on the substrate surface to form the compound, but does not cause the compound to crystallise. Stable, good quality amorphous compounds with useful properties are formed.

Experimental results Consider lithium borosilicate ($Li_4SiO_4.Li_3BO_3$) as an example lithium-containing oxide compound. In accordance with embodiments of the invention, this material is formed from the component elements lithium, oxygen and two glass-forming elements, boron and silicon. Several samples of lithium borosilicate were fabricated at a range of substrate temperatures using vapour deposition of these component elements in line with the embodiments described above, and characterized using Raman spectroscopy to determine their structure and properties. The depositions were carried out in a physical vapour deposition (PVD) system which has been previously described in the literature (Guerin, S. and Hayden, B. E., *Journal of Combinatorial Chemistry* 8, 2006, pages 66-73). Excluding the temperature, all samples were deposited under identical conditions, utilizing an oxygen plasma source as a source of atomic oxygen. The oxide materials, lithium silicate and lithium borate, require the highest oxidation states of both silicon and boron (4+ and 3+ respectively), and the use of atomic oxygen rather than molecular oxygen therefore removes the dissociation step required to break $O_2$ to 2O and provides a highly reactive species to oxidize silicon and boron into their highest oxidation states, as required in the materials $Li_4SiO_4$ and $Li_3BO_3$. Lithium was deposited from a Knudsen cell source. Silicon and boron were both deposited from electron gun (E-Gun) sources.

Initial work was carried out without heating (room temperature, giving a substrate temperature of 29° C.) because the amorphous state was the desired form of the material and the expectation was that heating would produce crystallization of the material, resulting in a deterioration of the ionic conductivity. The deposition carried out using even the highest flow of atomic oxygen at room temperature did not result in the material of interest, however. A lack of the required chemical reaction meant that no lithium borosilicate was formed on the substrate.

Surprisingly, it was then found that amorphous lithium borosilicate was formed when the substrate was heated, resulting in a material with the required structure and exhibiting a high ionic conductivity suitable for use as an electrolyte. The effect of different substrate temperatures during deposition was then investigated. The measurement of Raman spectra enabled the monitoring of the silicate and borate moieties as a function of deposition temperature, allowing the composition of the thin film to be determined.

Table 1 summarizes the results of these studies, in which the lithium borosilicate is considered as a Li—B—Si—O ternary system. No B—O or Si—O bonds were observed within samples deposited at temperatures between 29° C. and 150° C., indicating that no lithium borosilicate was formed. Materials deposited between 200° C. and 275° C. were noted to exhibit the desired silicate and borate moieties (Si—O and B—O). A minor change in composition (proportion of the various component elements: lithium, oxygen, boron and silicon) was observed at 275° C. due to loss of lithium at this elevated temperature.

TABLE 1

| Temperature/° C. | Composition | B—O | Si—O |
| --- | --- | --- | --- |
| 29 | — | Not observed | Not observed |
| 50-150 | No change | Not observed | Not observed |
| 150 | No change | Not observed | Not observed |
| 200 | No change | Pyro-borate, ortho-borate, borate ring | $Si_2O_7^{6-}$ dimer, $SiO_3^-$ chain, $Si_2O_5^{2-}$ sheet |
| 225 | No change | Pyro-borate, ortho-borate, borate ring | $Si_2O_7^{6-}$ dimer, $SiO_3^-$ chain, $Si_2O_5^{2-}$ sheet |
| 275 | Minor loss of Li (<5 at. %) | Pyro-borate, ortho-borate, borate ring | $Si_2O_7^{6-}$ dimer, $SiO_3^-$ chain, $Si_2O_5^{2-}$ sheet |

The results of Table 1 demonstrate that a substrate temperature of 150° C. or below fails to produce a lithium borosilicate thin film, whereas a substrate temperature of 200° C. or above enables the formation of lithium borosilicate. From these and other measurements, the inventors have concluded that heating the substrate to a temperature of about 180° C. or above is sufficient to enable the required chemical reaction to occur on the substrate surface so that the desired amorphous compound is formed. Regarding an upper temperature limit, without adjusting the sources in this example it would not be desirable to increase the substrate temperature above about 275° C. due to the loss of lithium. However, because of the use of separate sources for the metallic elements the rate of the lithium source could be increased to allow for deposition of material with the correct composition at temperatures higher than 275° C. The upper limit on temperature is the temperature at which crystallisation, and a concurrent decrease in ionic conductivity, would occur. A substrate temperature up to about 350° C. would be viable, since this will avoid crystallisation while still enabling compensation for lithium loss by source adjustment. The temperature range of 180° C. to 350° C. is expected to be applicable to all lithium-containing and glass-forming element containing oxide and oxynitride compounds, so that the present invention provides a reliable and simple way to produce amorphous samples of these materials.

Figure 2:
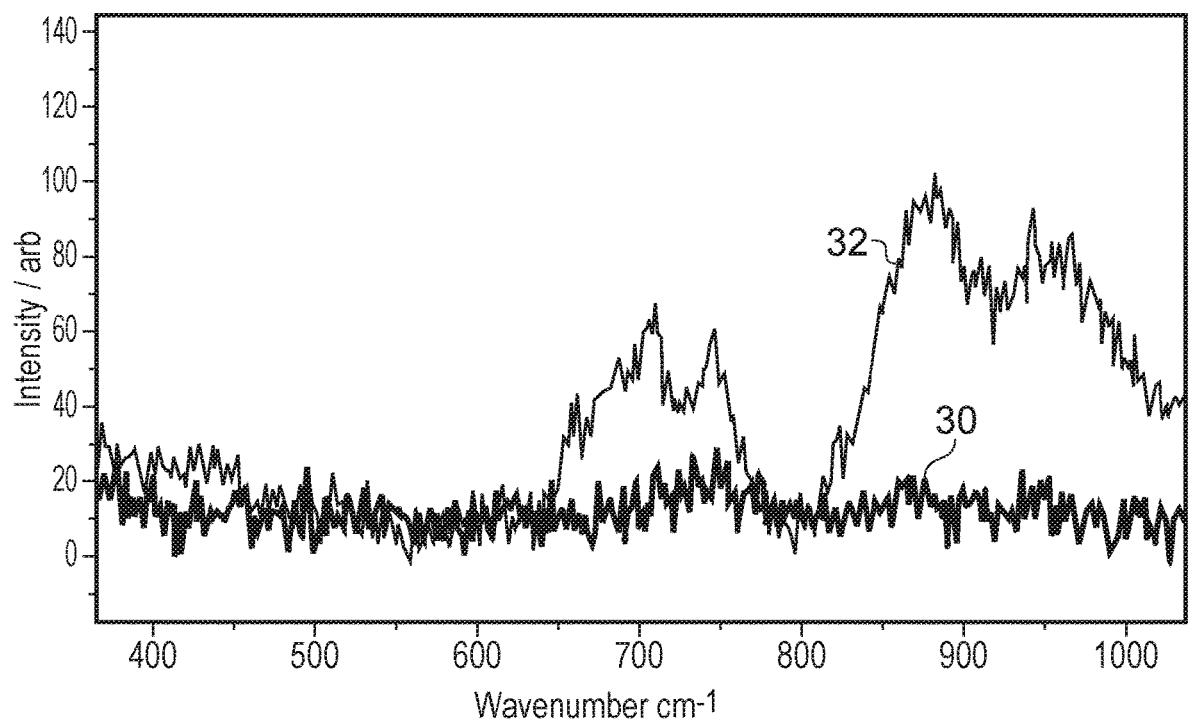
FIG. 2 shows Raman spectra of samples of material deposited according to a prior art method and a method according to an embodiment of the invention.

FIG. 2 shows the Raman spectra of $Li_{0.78}B_{0.11}Si_{0.11}$ (±1 at. %) deposited at room temperature (29° C.) and at 225° C., plotted as intensity against wavenumber. Line 30 shows the spectrum at 29° C. and line 32 shows the spectrum at 225° C. From these, it can be seen that the material deposited at room temperature does not contain the moieties of interest (no bands are observed in the region of interest). The material deposited at 225° C. exhibits bands which can be assigned to both the borate and silicate moieties of interest.

In addition, impedance measurements were carried out on the materials deposited at 29° C. and at 225° C. It was not possible to determine the ionic conductivity of the materials deposited at 29° C., since the material showed no ionic conductivity. This is consistent with the negligible formation of silicate and borate moieties. In contrast the material deposited at 225° C. exhibited a clear ionic conduction process, with a conductivity value of $3.2 \times 10^{-6}$ S cm$^{-1}$. The observation of this level of conductivity confirms both that the material of interest, lithium borosilicate, has been produced at elevated temperature and that crystallization has not occurred due to the heating of the material during the deposition. If the material had de-vitrified the ionic conductivity would be reduced by several orders of magnitude. X-ray diffraction of this material confirmed that crystallization had not occurred.

Thus, the unexpected result is obtained that an amorphous thin film of a lithium-containing oxide compound can be formed on a heated substrate.

Further Characterisation of Amorphous Lithium Borosilicate

As described, lithium borosilicate thin films were prepared at elevated temperatures, including 225° C. Contrary to expectations based on the understanding that heating causes crystallisation, these thin films were observed to be amorphous.

Figure 3:
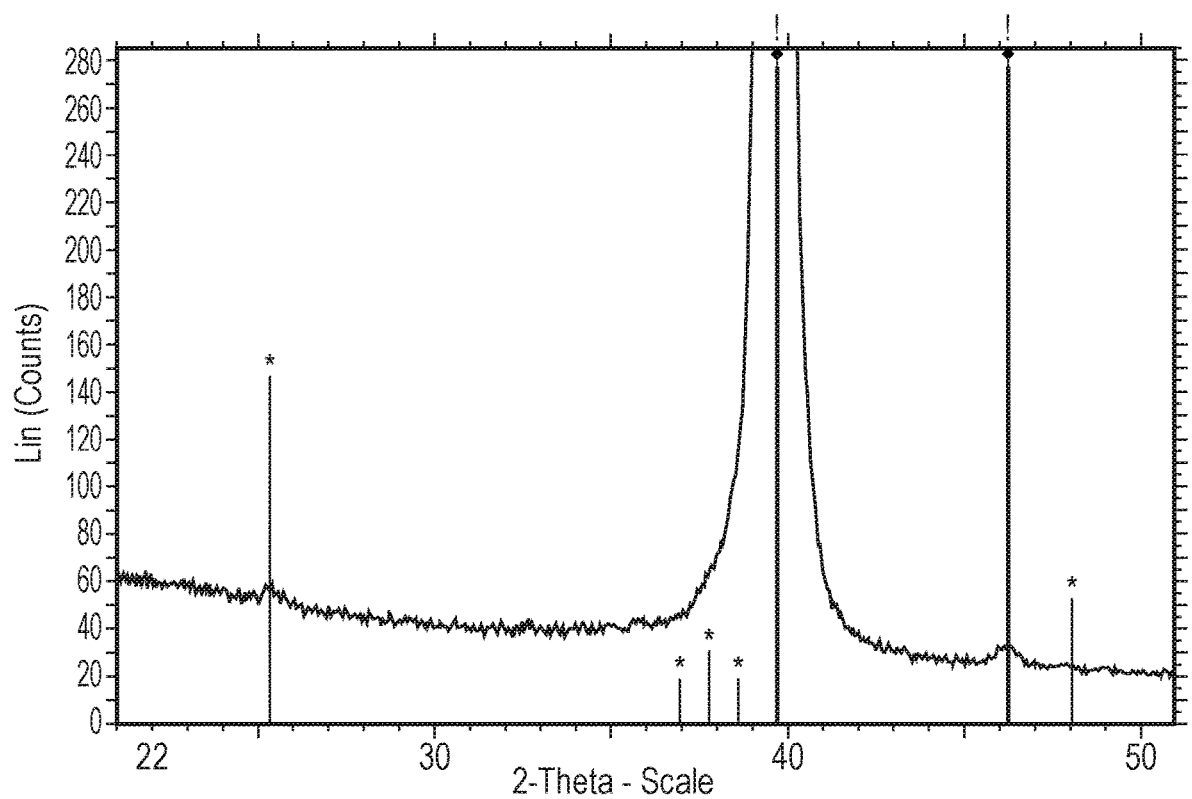
FIG. 3 shows an X-ray diffraction measurement of a sample of lithium borosilicate deposited by a method according to an embodiment of the invention.

FIG. 3 shows the results of X-ray diffraction measurements performed to investigate the crystal structure of the lithium borosilicate. As can be seen, the X-ray diffraction plot shows no clear peaks arising from lithium borosilicate. Rather, the peaks shown are attributable to the materials in the $Si/SiO_2/TiO_2/Pt$ substrate supporting the lithium borosilicate thin film. FIG. 3 includes reference patterns for Pt and $TiO_2$ (marked respectively with "!" and "*"), indicating that the observed peaks arise from the substrate rather than the thin film. The absence of any peaks attributable to lithium borosilicate indicate that the deposited material is amorphous.

To further test the lithium borosilicate samples, impedance measurements were carried out at room temperature to determine ionic conductivity.

Figure 4:
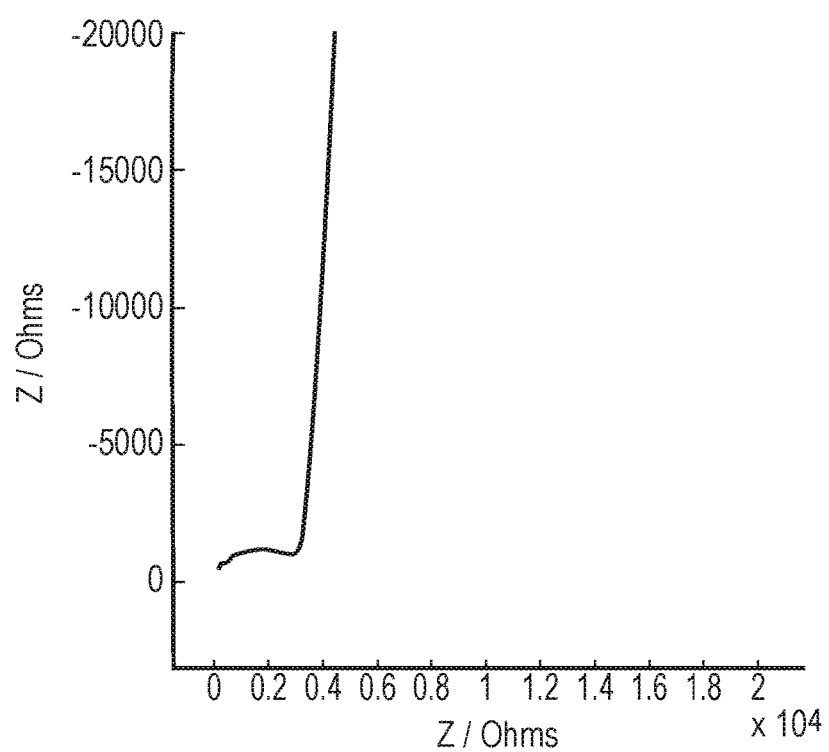
FIG. 4 shows an impedance spectrum of a sample of lithium borosilicate deposited by a method according to an embodiment of the invention.

FIG. 4 shows the results of the impedance measurements, as an impedance spectrum of a sample of lithium borosilicate deposited at a substrate temperature of 225° C. The chemical composition of this film was $Li_{0.77}B_{0.18}Si_{0.05}$. From these measurements, the ionic conductivity was determined to be $3.2 \times 10^{-6}$ S cm$^{-1}$. This makes the material suitable for use as an electrolyte in a lithium ion battery, and is comparable to the ionic conductivity of the current most commonly used thin film electrolyte material, LiPON ($3 \times 10^{-6}$ S cm$^{-1}$).

Further Experimental Results

The above-described fabrication of lithium borosilicate was modified to demonstrate its flexibility and applicability to the production of other lithium-containing oxide and oxynitride compounds. Nitrogen-doped lithium borosilicate was produced by introducing nitrogen into the gas feed to the oxygen plasma source, to deliver a mixed oxygen-nitrogen flux. The lithium, boron and silicon were provided as previously described, and the temperature of the substrate was 225° C. A range of substrate temperatures similar to that demonstrated for undoped lithium borosilicate is also applicable to the nitrogen-doped materials, i.e. about 180° C. to about 350° C., with the narrower range of about 180° C. to about 275° C. likely to produce quality material in a simple way, for example without the need to adjust for lithium loss.

Figure 5:
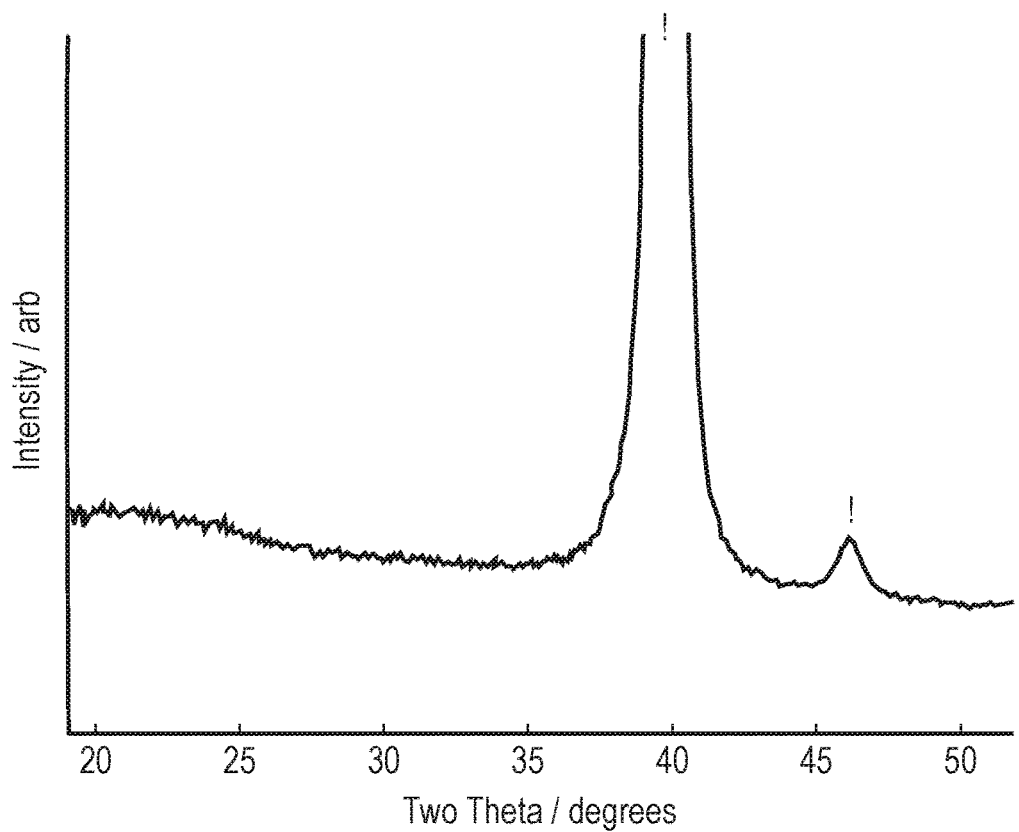
FIG. 5 shows an X-ray diffraction measurement of a sample of nitrogen-doped lithium borosilicate deposited by a method according to an embodiment of the invention.

FIG. 5 shows a measured X-ray diffraction plot of the resulting nitrogen-doped lithium borosilicate thin film. The peaks on the graph (marked with a "!") are attributable to platinum in the AlOPt substrate. The absence of other peaks indicates that the sample was amorphous and lacking in crystalline structure.

Figure 6:
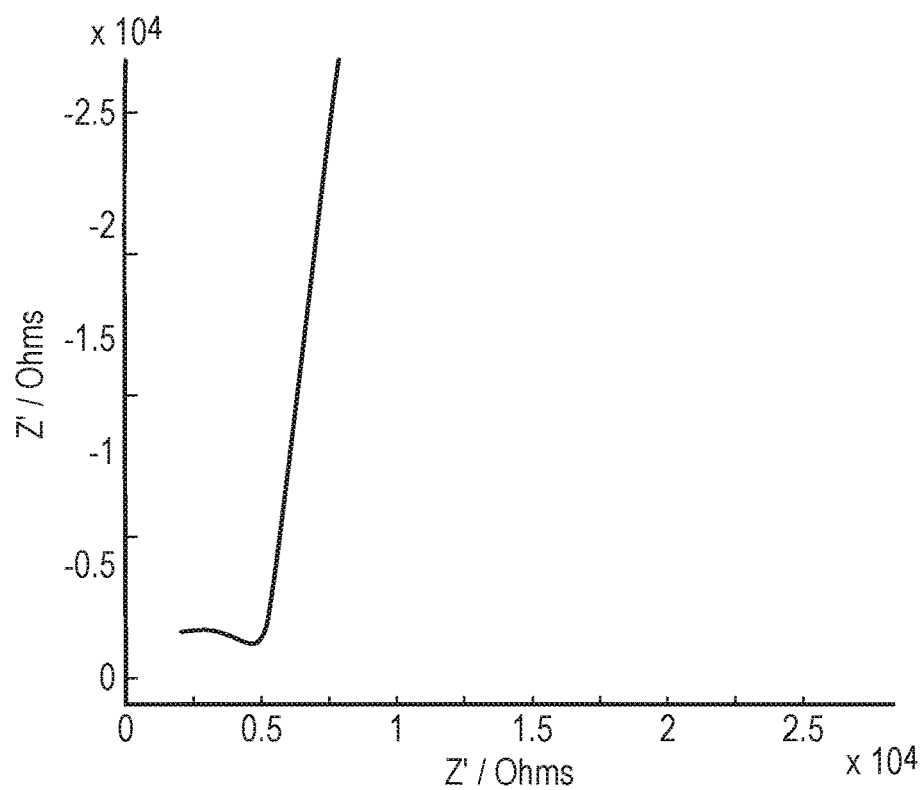
FIG. 6 shows an impedance spectrum of a sample of nitrogen-doped lithium borosilicate deposited by a method according to an embodiment of the invention.

FIG. 6 shows an impedance spectrum of the nitrogen-doped lithium borosilicate thin film, which had a composition of $Li_{0.78}B_{0.06}Si_{0.16}$. From this measurement, the ionic conductivity is determined to be $7.76\times10^{-6}$ S cm$^{-1}$. These results demonstrate the flexibility of this process, which easily enables the successful doping of amorphous lithium borosilicate with nitrogen. The doping demonstrates a clear improvement in the ionic conductivity of the compound from $3.2\times10^{-6}$ S cm$^{-1}$ to $7.76\times10^{-6}$ S cm$^{-1}$. This improves the performance of the material significantly beyond that shown previously for the electrolyte material LiPON and therefore provides a simple and effective means to enhance the performance of a solid state battery.

Demonstration of an Operating Battery

The amorphous nature of the undoped and doped lithium borosilicate and the accompanying high ionic conductivities indicate that these thin films are well-suited for use as the electrolyte in a thin film battery. Various thin film batteries were created using the described vapour deposition process and characterised to show full functionality.

Figure 7:
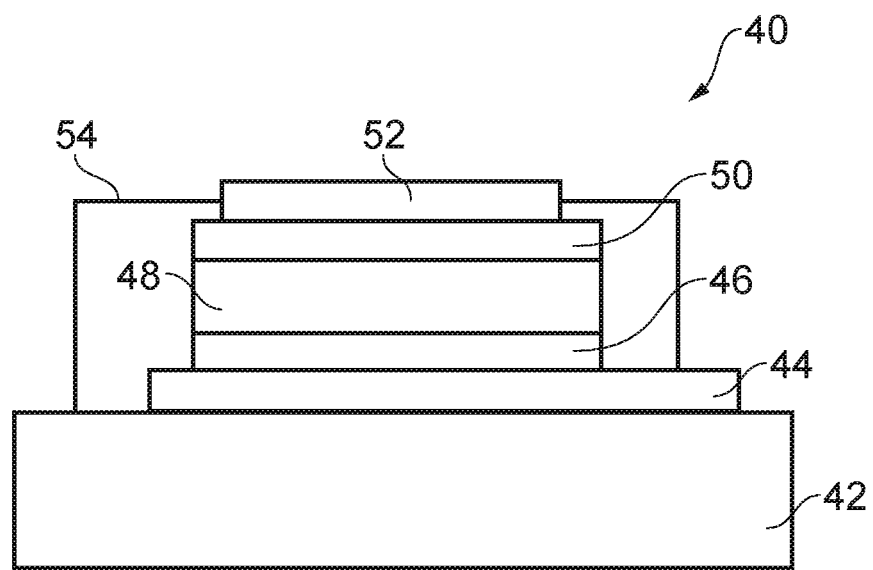
FIG. 7 shows a schematic cross-sectional view of an example thin film battery of conventional structure.

FIG. 7 shows a schematic cross-sectional view of an example lithium ion thin film battery or cell 40 of typical structure. Such batteries comprise a series of layers, typically formed by one or more deposition or other fabrication processes. A substrate 42 supports the various layers. In order starting from the substrate these are a cathode current collector 44, a cathode 46, a electrolyte 48, an anode 50 and an anode current collector 52. A protective encapsulation layer 54 is formed over all the layers. Other battery structures are possible too, for example the anode and cathode positions may be reversed, and the encapsulation layer may be omitted.

Samples including cathode, electrolyte and anode layers were fabricated in experiments to demonstrate an operating cell. In this example, depositions of the three constituent films of the thin film battery (cathode, electrolyte and anode) were carried out within a ultra high vacuum system onto sapphire substrates coated with $TiO_2$ (10 nm) and Pt (100 nm) (AlOPt substrate, from Mir Enterprises). For the cathode, a thin film of lithium manganese oxide (LMO) was synthesised from lithium, manganese and oxygen sources. The manganese and lithium were deposited from Knudsen cells while the oxygen was provided by a plasma atom source. The deposition was carried out for 7620 seconds, giving a thin film of uniform thickness of 300 nm. The temperature of the substrate was held at 350° C. to provide a crystalline material. At the end of the LMO deposition the lithium and manganese source shutters were closed to block the flux of these elements. The substrate was cooled from 350° C. to 225° C. over a period of 360 seconds, during which time exposure to the flux of atomic oxygen continued.

The electrolyte was a thin film of lithium borosilicate, in accordance with embodiments of the invention. It was synthesised using lithium, boron, silicon and oxygen sources. As for the cathode, the lithium was deposited from a Knudsen cell and the plasma source provided atomic oxygen. The boron and silicon were deposited from electron beam evaporators. The substrate was maintained at 225° C. during deposition of the electrolyte, which continued for 14400 seconds to give a thin film of thickness 800 nm. This process is merely exemplary, however, and an amorphous lithium borosilicate electrolyte layer for a battery could be deposited using alternative sources for the various component elements, and at other temperatures and for other times, as discussed above.

Following this, a physical mask was placed in front of the sample to define discrete batteries of 1×1 mm, without removing the sample from the vacuum. This took less than 600 seconds. Then, a tin oxide anode was deposited using a Knudsen cell tin source and the atomic oxygen plasma source, over the course of 180 seconds. The thickness of the resulting anode layer was estimated at 9.6 nm (based on calibration measurements). Finally, a 100 nm layer of nickel was added as a top current collector using a second mask with 1.5×15 mm apertures, again with the sample remaining in the vacuum. Thus, a LMO/LBSiO/SnO$_2$ thin film battery was produced.

X-ray diffraction measurements confirmed that the LMO cathode deposited at 350° C. was crystalline, and that the lithium borosilicate electrolyte deposited at 225° C. was amorphous, as expected according to the invention.

Note that although in this example each of the cathode, electrolyte and anode layers were fabricated using vapour deposition of the component elements onto a heated substrate, the cathode and anode layers could be made by any convenient and appropriate thin film fabrication process, as preferred. Other cathode and anode materials could also be used, fabricated as desired.

To test operation of the cell, contact was made via two pin probes within a glove box. Charge and discharge measurements were carried out using a constant current-constant voltage (CC/CV) instrument.

Figure 8:
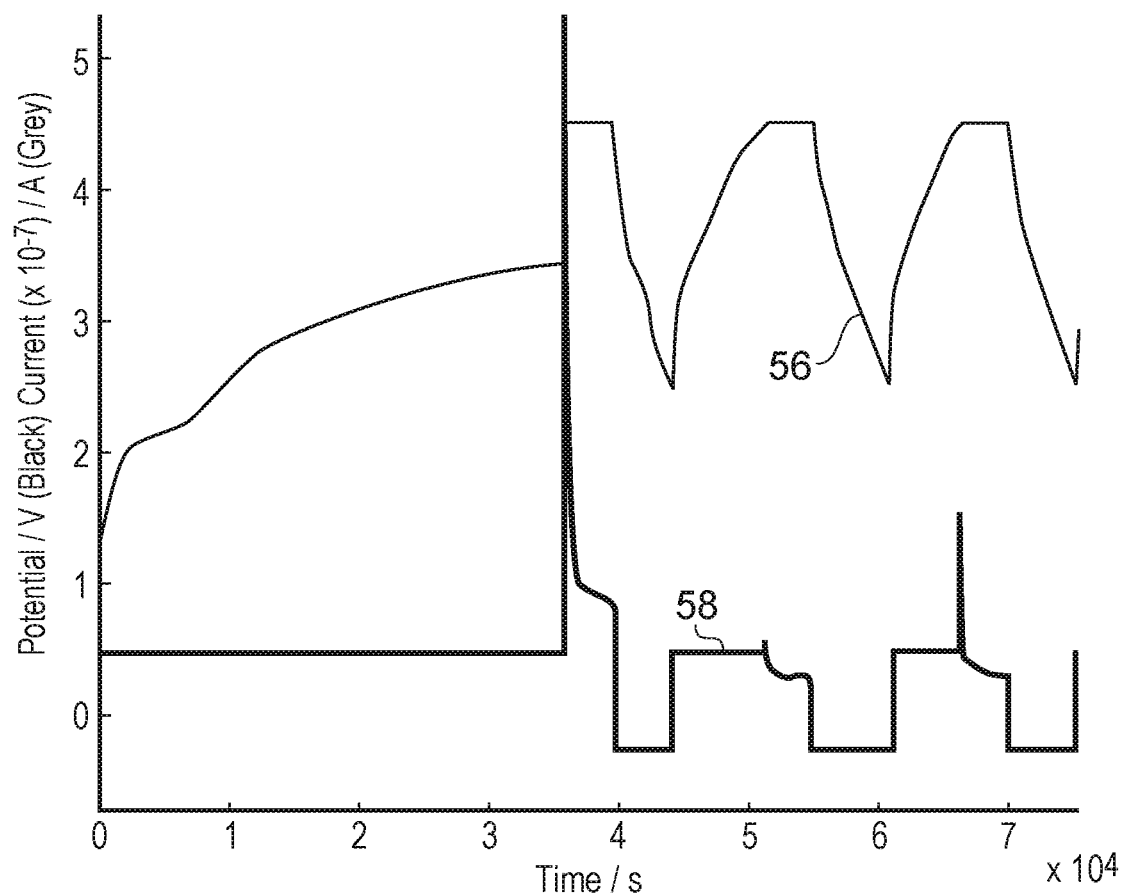
FIG. 8 shows a graph of voltage and current versus time for charge/discharge cycles of a thin film battery having a lithium borosilicate electrolyte deposited by a method according to an embodiment of the invention.
Figure 9:
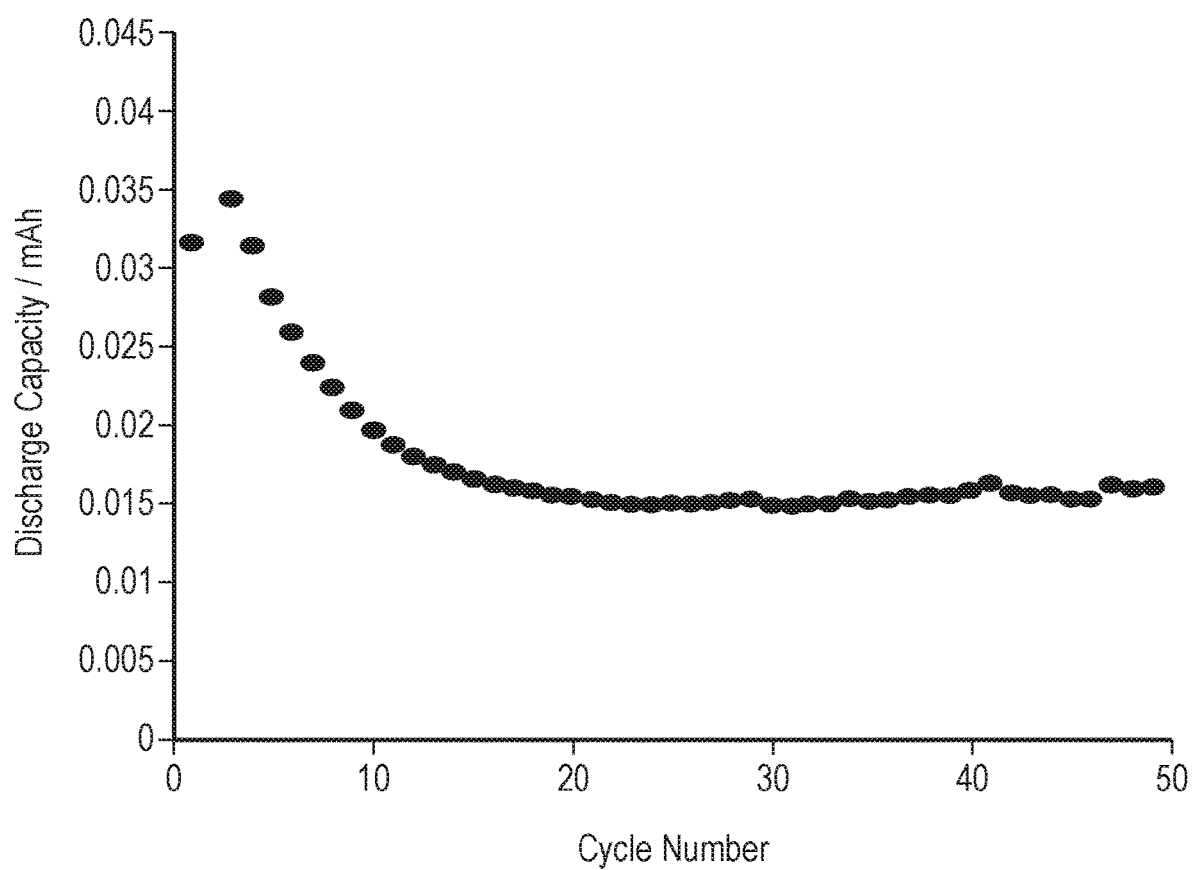
FIG. 9 shows a graph of measurements of the discharge capacity of the same battery.

FIGS. 8 and 9 show the results of these measurements. FIG. 8 shows a plot of voltage and current versus time for the first charge/discharge cycles. Curve 56 shows the cell potential, and curve 58 shows the current. FIG. 9 shows measurements of the discharge capacity over the first 50 cycles. The cell demonstrated a maximum in capacity over the first 10 cycles, with the capacity stabilising after 20 cycles. A maximum discharge capacity of 0.077 mA h was observed in cycle 2 (corresponding to 25.4 mA h cm$^{-2}$ μm$^{-1}$). This corresponds to 83% of the theoretical capacity, based on an anode limited system. Following 20 cycles the capacity was observed to drop to 0.015 mA h (4.9 mA h cm$^{-2}$ μm$^{-1}$) corresponding to 33% of the theoretical capacity, based on an anode limited system. The capacity was noted to stabilise at this level and following a further 29 cycles the capacity was observed to be 0.016 mA h.

It is believed that this is the first reported demonstration of a fully functioning thin film battery in which all of the cathode, electrolyte and anode layers were deposited as thin film layers directly from the component elements.

Temperature

As discussed above, according to the invention, the substrate is heated to above about 180° C., and possibly in the range 180° C. to 350° C. The actual temperature selected in practice will depend on various factors. The fairly wide range of operating temperatures available under the invention is attractive, since it facilitates matching the substrate temperature to temperatures required for other processing steps in a fabrication process. For example, a temperature the same as or similar to temperatures required for other steps in a process, such as cathode deposition, might be chosen to minimise adjustments. For a device including a crystalline cathode or other layer, a temperature towards the top of the range might therefore be preferred. On the other hand, substrate temperatures at the lower end of the range may be attractive if one is interested in reducing energy usage and hence production costs. There is hence a freedom available when selecting operating parameters for implementing the invention, and the temperature can be chosen to best fit with other requirements. A temperature from the lower end of the range, say from 180° C. to 250° C. or 275° C., or from the middle of the range, say from 200° C. to 300° C., or from the top of the range, say from 250° C. to 350° C., might be chosen according to circumstances.

Further Materials

Thus far, the fabrication of amorphous lithium borosilicate and nitrogen-doped lithium borosilicate has been described. However, the invention is not limited to these materials, and the process of deposition of the component elements directly onto a heated substrate is applicable to the production of other lithium containing oxide and oxynitride compounds. Further examples include lithium silicates and lithium borates, and other compounds containing glass-forming elements including boron, silicon, germanium, aluminium, arsenic and antimony. Amorphous oxides and oxynitrides can be expected to be able to be prepared by methods according to the invention, since the chemistry of binary oxides can be expected to be very similar to that of the ternary oxide/oxynitride glasses.

Substrates

The experimental results presented herein relate to thin films deposited onto titanium and platinum coated sapphire substrates and titanium and platinum coated silicon substrates. Other substrates may be used if preferred however. Other suitable examples include quartz, silica, glass, sapphire, and metallic substrates including foils, but the skilled person will understand that other substrate materials will also be suitable. Requirements for the substrate are that an appropriate deposition surface is provided and that it can withstand the required heating; otherwise the substrate material can be selected as desired with reference to the application to which the deposited compound is to be put.

Also, the embodiments of the invention are applicable equally to the deposition of the component elements directly onto the substrate surface, and onto one or more layers previously deposited or otherwise fabricated on the substrate. This is evident from the experimental results discussed above, where lithium borosilicate films were deposited onto otherwise empty heated substrates, and onto a LMO cathode layer when fabricating a sample battery. Thus, reference in this application to "a substrate" "depositing onto a substrate", "co-depositing onto a substrate" and similar apply equally to "a substrate supporting one or more pre-fabricated layers", "depositing onto a layer or layers previously fabricated on a substrate", "co-depositing onto a layer or layers previously fabricated on a substrate" and the like. The invention applies equally whether or not there are any other layers intervening between the substrate and the amorphous lithium-containing oxide or oxynitride compound being deposited.

Applications

The amorphous nature of the materials able to be deposited in accordance with invention, combined with the excellent ionic conductivities, make the materials well-suited for use as electrolytes in thin film batteries, and this is expected to be a major application. The methods of the invention are readily adaptable to the manufacture of battery components within devices such as sensors, photovoltaic cells and integrated circuits and the like. However, the materials are not limited to use as electrolytes, and the method may be used to deposit layers of the amorphous lithium-containing oxide or oxynitride compound for any other applications. Possible examples include sensors, lithium separators, interface modifiers and ion conductors within electrochromic devices.

Vapour Deposition with Molecular Oxygen

As discussed so far, robust samples of amorphous lithium-containing oxide and oxynitride compounds can be deposited from vapour sources of the component elements by using an elevated substrate temperature. However, as mentioned, it is also possible to obtain amorphous compounds at lower substrate temperatures (up to about 100° C. if the oxygen vapour source delivers molecular oxygen). Thus, if one requires amorphous compounds that may not be resistant to crystallisation if later exposed to high temperatures, one can utilise the described vapour deposition methods without heating the substrate, or heating it only by a modest amount, if molecular oxygen is used.

All embodiments described thus far are expected to apply equally to this embodiment, with the substitution of a lower substrate temperature and the oxygen vapour source being restricted to molecular oxygen. Thus, boron and silicon vapour sources can be used to produce lithium borosilicate, plus a nitrogen vapour source to produce nitrogen-doped lithium borosilicate. Inclusion of a nitrogen source is more generally applicable to produce oxynitride compounds. Lithium silicates, oxynitride lithium silicates, lithium borates and oxynitride lithium borates may also be deposited, as can other lithium-containing oxides and oxynitrides, for example containing one or more other glass-forming elements such as germanium, aluminium, arsenic and antimony. The substrate material examples previously given are also applicable, as are the options of depositing directly onto a substrate or onto one or more layers already on a substrate.

Regarding temperature, embodiments using molecular oxygen can conveniently be performed at room temperature, thereby eliminating the need to heat the substrate. By "room temperature", we mean temperatures in the range of about 18° C. to 30° C., in particular about 25° C. However, temperatures outside this range may also be used, such as about 10° C. to 20° C., about 15° C. to 25° C., not higher than about 25° C., and about 20° C. to 30° C. Also, somewhat higher temperatures may be used, which can be useful for integrating with other steps in a fabrication process. Thus, the substrate temperature may be not more than about 30° C., not more than about 50° C., not more than about 70° C. or not more than about 100° C. At higher temperatures, the correct material is not formed. Deposition of lithium borosilicate onto a substrate with a platinum layer produces crystalline $LiPt_7$, for example. Examination of materials deposited at elevated temperatures using molecular oxygen by Raman spectroscopy reveals that the bands associated with the lithium borosilicate phase of interest are absent. Therefore, the upper substrate temperature for deposition is chosen with regard to avoiding the unwanted phases of lithium compounds which are prone to occur at higher temperatures and to ensure that the required phase is obtained. Typically, an upper temperature of substantially 100° C. will be appropriate to avoid or minimise unwanted phases.

Apparatus such as that shown in FIG. 1 and described above, are suitable for implementing these embodiments. The vapour source 18 will comprise a source of molecular oxygen, however. The heater 16 may be included to achieve a particular desired substrate temperature in line with the examples in the preceding paragraph, or may be omitted or simply not used if a general "room temperature" that is not specifically defined is deemed satisfactory.

REFERENCES

[1] Julien, C. M.; Nazri, G. A., Chapter 1. Design and Optimisation of Solid State Batteries. In *Solid State Batteries: Materials Design and Optimization*, 1994
[2] Bates, J. B.; Gruzalski, G. R.; Dudney, N. J.; Luck, C. F.; Yu, X., Rechargeable Thin Film Lithium Batteries. *Oak Ridge National Lab and Solid State Ionics* 1993
[3] Bates, J. B.; Dudney, N. J.; Neudecker, B.; Gruzalski, G. R.; Luck, C. F. Thin Film Battery and Method for Making Same, U.S. Pat. No. 5,338,625
[4] Tatsumisago, M.; Machida, N.; Minami, T., Mixed Anion Effect in Conductivity of Rapidly Quenched $Li_4SiO_4$—$Li_3BO_3$ Glasses. *Yogyo-Kyokai-Shi* 1987, 95(2), 197-201
[5] Machida, N.; Tatsumisago, M.; Minami, T., Preparation of amorphous films in the systems Li 2O—SiO 2 and Li 2O—B 2O 3-SiO 2 by RF-sputtering and their ionic conductivity. *Yogyo-Kyokai-Shi* 1987, 95, (1), 135-7
[6] (Hu, Z.; Xie, K.; Wei, D.; Ullah, N., Influence of sputtering pressure on the structure and ionic conductivity of thin film amorphous electrolyte. *Journal of Materials Science* 2011, 46, (23), 7588-7593
[7] Choi, C. H.; Cho, W. I.; Cho, B. W.; Kim, H. S.; Yoon, Y. S.; Tak, Y. S., Radio-Frequency Magnetron Sputtering Power Effect on the Ionic Conductivities of Lipon Films. *Electrochemical and Solid-State Letters* 2002, 5, (1), A14-A17
[8] Zhao, S.; Fu, Z.; Qin, Q., A solid-state electrolyte lithium phosphorus oxynitride film prepared by pulsed laser deposition. *Thin Solid Films* 2002, 415, (1-2), 108-113
[9] Julien, C. M.; Nazri, G. A., Chapter 4. Materials for electrolyte: Thin Films. In *Solid State Batteries: Materials Design and Optimization*, 1994
[10] WO 2013/011326
[11] WO 2013/011327
[12] Varshneya, A. K., *Fundamentals of Inorganic Glasses*, Academic Press, page 33
[13] Guerin, S. and Hayden, B. E., *Journal of Combinatorial Chemistry* 8, 2006, pages 66-73

The invention claimed is:

1. A vapour deposition method for preparing an amorphous lithium-containing oxide or oxynitride compound not containing phosphorous, the method comprising:
providing a vapour source of each component element of the compound, wherein the vapour sources comprise at least a source of lithium, a source of oxygen, and a source or sources of one or more glass-forming elements;
heating a substrate to 180° C. or above; and
co-depositing the component elements from the vapour sources onto the heated substrate, wherein the component elements react on the substrate to form the amorphous compound,
in which the source or sources of one or more glass-forming elements comprises:
a. a source of boron and a source of silicon, and the amorphous compound is lithium borosilicate; or
b. a source of boron, a source of silicon and a source of nitrogen, and the amorphous compound is nitrogen-doped lithium borosilicate.

2. The vapour deposition method according to claim 1, in which the vapour source of oxygen is a vapour source of atomic oxygen.

3. The vapour deposition method according to claim 2, in which the amorphous compound is a lithium-containing oxynitride compound containing the one or more glass-forming elements and not containing phosphorous, and the method comprises introducing nitrogen into a feed of a plasma source of the atomic oxygen to provide a mixed oxygen-nitrogen plasma for co-deposition onto the heated substrate.

4. The vapour deposition method according to claim 1, in which co-depositing the component elements onto the heated substrate comprises co-depositing the component elements directly onto a surface of the heated substrate or onto one or more layers supported on the substrate.

5. The method according to claim 1, in which the source or sources of the one or more glass-forming elements comprises a source of boron and a source of silicon, and the amorphous compound is lithium borosilicate.

6. The vapour deposition method according to claim 5, wherein the heating the substrate includes heating the substrate to a temperature in a temperature range between 180° C. and 350° C.

7. The method according to claim 1, in which the source or sources of the one or more glass-forming elements comprises a source of boron, a source of silicon and a source of nitrogen, and the amorphous compound is nitrogen-doped lithium borosilicate.

8. The vapour deposition method according to claim 7, wherein the heating the substrate includes heating the substrate to a temperature in a temperature range between 180° C. and 350° C.

9. A method of making a battery, comprising depositing an electrolyte of the battery as a layer of the amorphous lithium-containing oxide or oxynitride compound containing the one or more glass-forming elements and not containing phosphorous using the vapour deposition method according to claim 1.

10. A vapour deposition method for preparing an amorphous lithium-containing oxide or oxynitride compound not containing phosphorous, the method comprising:
providing a vapour source of each component element of the compound, wherein the vapour sources comprise at least a source of lithium, a source of molecular oxygen, and source or sources of one or more glass-forming elements;
providing a substrate at a temperature below 100° C.; and
co-depositing the component elements from the vapour sources onto the substrate, wherein the component elements react on the substrate to form the amorphous compound,
in which the source or sources of one or more glass-forming elements comprises:
a. a source of boron and a source of silicon, and the amorphous compound is lithium borosilicate; or
b. a source of boron, a source of silicon and a source of nitrogen, and the amorphous compound is nitrogen-doped lithium borosilicate.

11. The vapour deposition method according to claim 10, in which co-depositing the component elements onto the substrate comprises co-depositing the component elements directly onto a surface of the substrate or co-depositing the component elements onto one or more layers supported on the substrate.

12. The method according to claim 10, in which the source or sources of the one or more glass-forming elements comprises a source of boron and a source of silicon, and the amorphous compound is lithium borosilicate.

13. The vapour deposition method according to claim 12, wherein the providing a substrate at a temperature below 100° C. includes providing the substrate at a temperature in a temperature range between 18° C. and 30° C.

14. The method according to claim 10, in which the source or sources of the one or more glass-forming elements comprises a source of boron, a source of silicon and a source of nitrogen, and the amorphous compound is nitrogen-doped lithium borosilicate.

15. The vapour deposition method according to claim 14, wherein the providing a substrate at a temperature below 100° C. includes providing the substrate at a temperature in a temperature range between 18° C. and 30° C.

* * * * *